United States Patent
Kimata

[19]

[11] Patent Number: 6,087,844
[45] Date of Patent: Jul. 11, 2000

[54] IC TESTING DEVICE

[75] Inventor: Yoshiaki Kimata, Tokyo, Japan

[73] Assignee: Ando Electric Co., Ltd., Tokyo, Japan

[21] Appl. No.: 08/936,266

[22] Filed: Sep. 24, 1997

[30] Foreign Application Priority Data

Sep. 27, 1996 [JP] Japan .................................. 8-257169

[51] Int. Cl.⁷ .................................................. G01R 31/26
[52] U.S. Cl. ...................................... 324/765; 324/158.1
[58] Field of Search .................................... 324/754, 765, 324/158.1

[56] References Cited

U.S. PATENT DOCUMENTS 4,942,358  7/1990  Davis et al. ............................ 324/764
5,640,102  6/1997  Sato ....................................... 324/755

Primary Examiner—Glenn W. Brown
Attorney, Agent, or Firm—Fish & Richardson P.C.

[57] ABSTRACT

The object of the present invention is to offer an IC testing device capable of operating a plurality of test stations independently of each other. A solid-state relay 11 is provided on each test station, and performs ON/OFF control of a 200 V AC supply to a first power source 9 and a second power source 10. Additionally, the analog circuit 7 and pin electronics section 8 of each test station are respectively connected to a DC section 5 of an IC testing device main body 2 by testing buses. Similarly, the analog circuit 7 and pin electronics section 8 of each test station are respectively connected to an LS section 6 of an IC testing device main body 2 by testing buses. Consequently, each unit of a test station is capable of exchanging data with the IC testing device main body 2 even if only the solid-state relay 11 of one testing station is ON.

4 Claims, 2 Drawing Sheets

IC TESTING DEVICE

BACKGROUND OF THE INVENTION

1. Field of the Invention

The present invention relates to IC testing devices for performing characteristic tests on ICs (Integrated Circuits) such as general-purpose AD converters, DA converters, and AD/DA converters with internal UCPUs microcomputers.

2. Background Art

FIG. 2 is a block diagram showing an example of the structure of a conventional IC testing device.

In the drawing, the analysis sample 1 is an IC which is the object of analysis, which in this example is a general-purpose AD converter.

Additionally, this testing device can be largely divided into an IC testing device main body 102 and two test stations (test station 103 and test station 104).

In this case, the IC testing device main body 102 is composed of a DC section 5, an LS section 6 and a solid-state relay 111. The DC section 5 measures the direct current characteristics of the analysis sample 1 based on analysis data received from test station 103 and test station 104. The LS section 6 selects the voltage level to be applied to the I/O terminals of analysis sample 1 for each terminal of the analysis sample 1.

Additionally, test station 103 and test station 104 are respectively composed of an analog circuit 7, a pin electronics section 8 and a power source 9.

While the internal components of test station 103 and test station 104 are identical in the drawing, they are not necessarily identical.

The analog circuit 7 has a digital/analog converter (DAC), which DA converts analysis data (digital values) received from the IC testing device 102, and inputs the DA converted analog voltages into the analog input terminals ($A_{in}$ terminals) of the analysis sample 1 (AD converter).

The pin electronics section 8 compares digital values (digital values AD converted by analysis sample 1) outputted from the I/O terminals of the analysis sample 1 (AD converter) with reference values (digital values) received from the IC testing device main body 102.

Additionally, a tester bus which extends from the DC section 5 of the IC testing device main body 102 is serially connected in the order of analog circuit 7 of test station 103, pin electronics section 8 of test station 103, analog circuit 7 of test station 104 and pin electronics section 8 of test station 104.

Similarly, a tester bus which extends from LS section 6 of IC testing device main body 102 is serially connected in the order of the analog circuit 7 of test station 103, the pin electronics section 8 of test station 103, the analog circuit 7 of test station 104 and the pin electronics section 8 of test station 104.

Additionally, a solid-state relay 111 of the IC testing device main body 102 performs ON/OFF control of a 200 V AC supply to a power source 109 of each test station.

Since the above-described conventional IC testing device shares the solid-state relay for performing ON/OFF control of the power source between the test stations, it is not capable of activating only one of the test stations.

For this reason, even in cases where a single test station is sufficient to perform the analyses due to reasons such as the number of ICs to be tested being few, both test stations must always be activated, thus wastefully expending electrical power.

Additionally, since the above-described conventional IC testing device serially connects the units of each test station by means of a tester bus, the flow of signals to the other test station is stopped in cases such as when one test station has failed, thus lowering the rate of operation of the device overall.

SUMMARY OF THE INVENTION

The present invention has been achieved in view of this background, and has the object of offering an IC testing device wherein the test stations are capable of operating independently, as a result of which the energy expenditure is low and the rate of operation is high.

The present invention is characterized by comprising at least two test stations, having an analysis unit for analyzing characteristics of an IC (integrated circuit) based on signals from control means; a power source for supplying electrical voltage to the analysis unit; and power source control means for performing ON/OFF control of the power source.

Additionally, the present invention is preferably such that each of the analysis units directly exchanges signals with the control means.

Additionally, the present invention is preferably such that each of the power sources has an analog power supply section, the analog power supply section being grounded separately for each test station.

According to the present invention, the power sources are capable of being ON/OFF controlled for each test station, so that even when one of the test stations is inoperable, ICs can be analyzed by the other test station, thereby increasing the rate of operation of the device.

Additionally, when a single test station is sufficient to perform the analyses due to the number of ICs being analyzed being few, the other test station can be stopped, thereby saving electrical power.

DESCRIPTION OF PREFERRED EMBODIMENTS OF THE INVENTION

Hereinbelow, embodiments of the present invention shall be explained with reference to the drawings.

Figure 1:
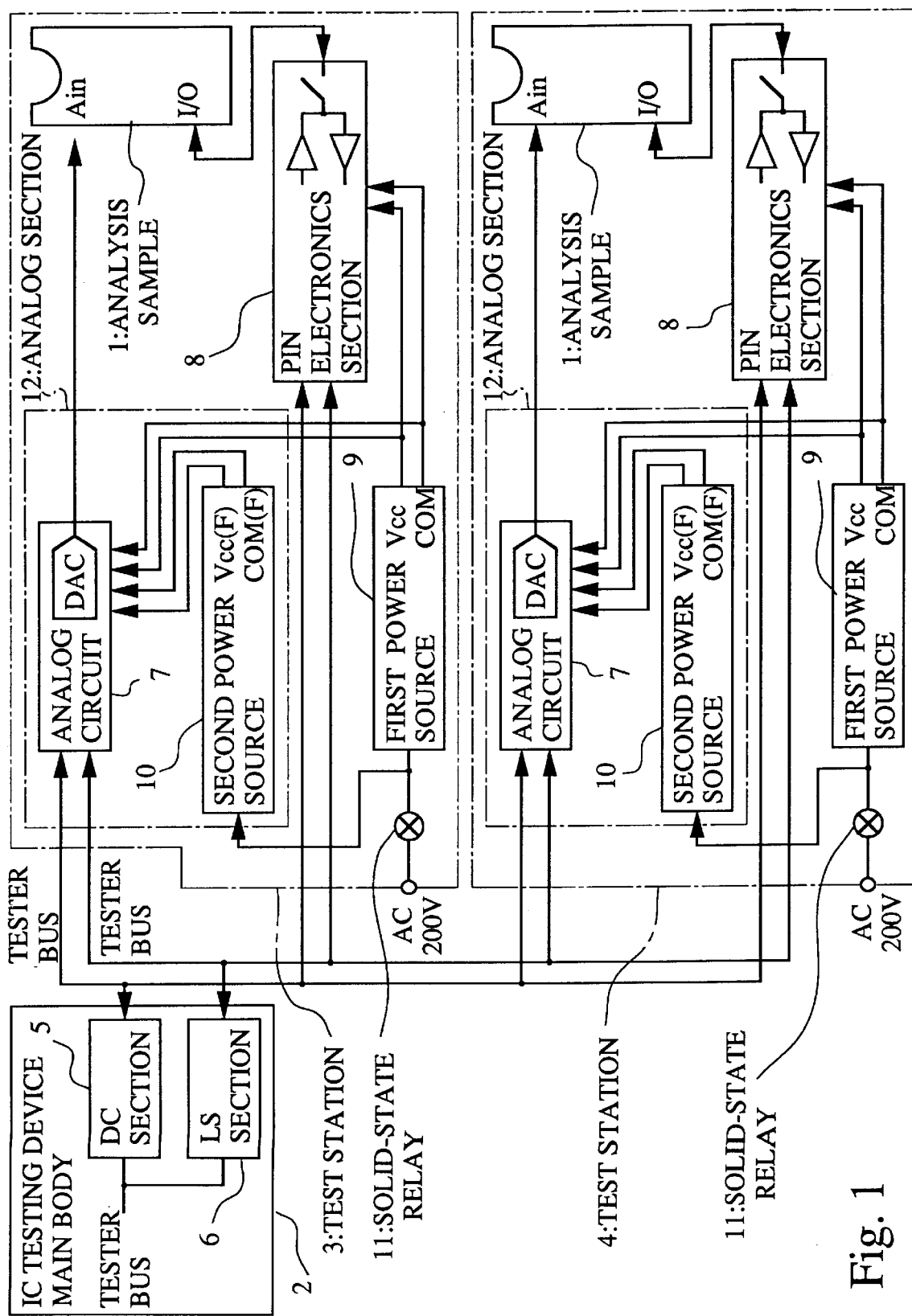
FIG. 1 is a block diagram showing an example of the structure of an IC testing device according to an embodiment of the present invention.
Figure 2:
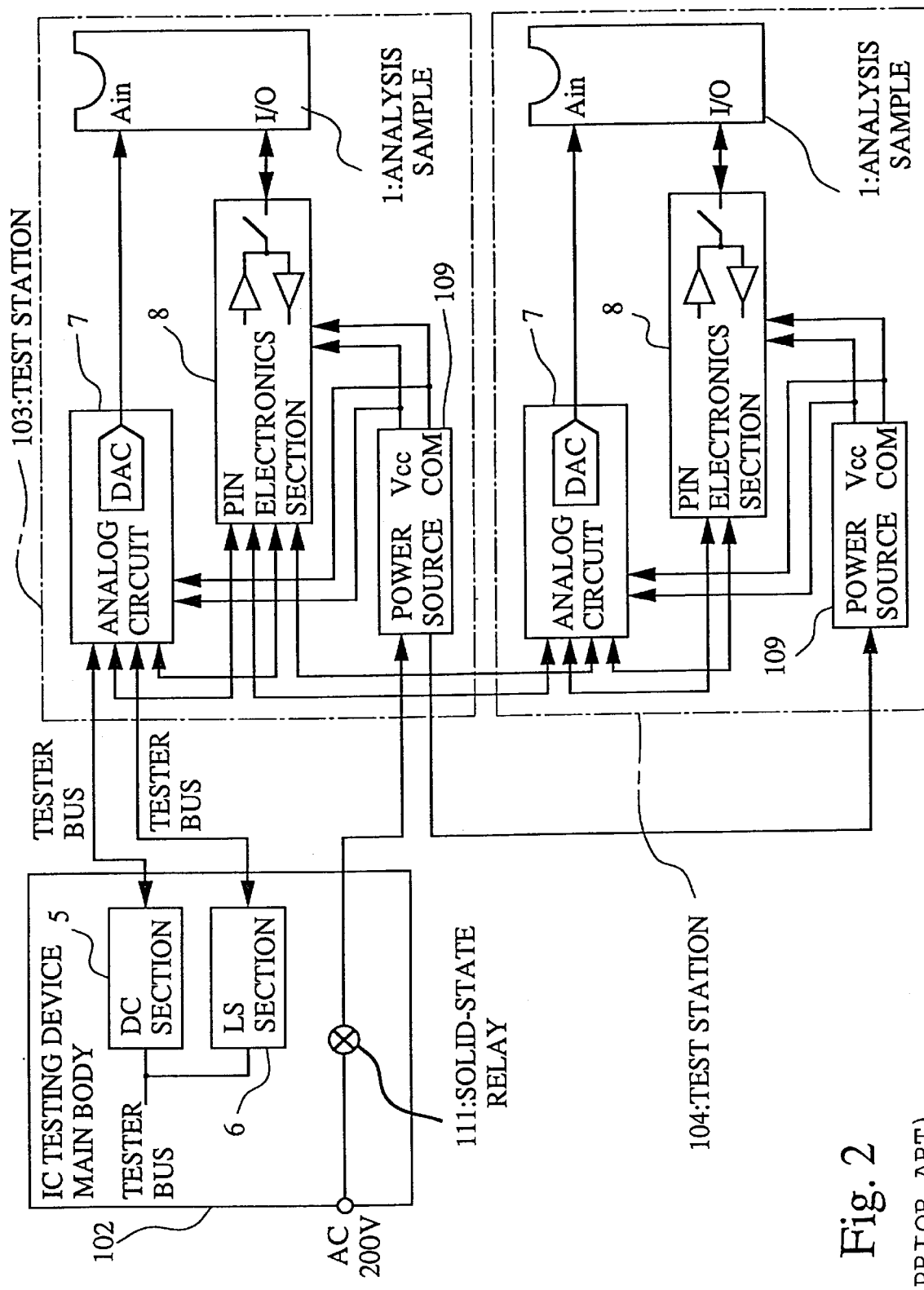
FIG. 2 is a block diagram showing an example of the structure of a conventional IC testing device.

FIG. 1 is a block diagram showing an example of the structure of an IC testing device according to an embodiment of the present invention.

In this drawing, the analysis sample 1 is an IC which is the object of analysis. As the analysis sample 1, it is possible to give as examples general-purpose AD converters, DA converters, and AD/DA converters having internal UCPUs. Below, the present embodiment is explained by an example wherein the analysis sample is a general-purpose AD converter.

Additionally, as shown in FIG. 1, the present device is composed of an IC testing device main body 2 and two test stations (test station 3 and test station 4) when divided largely.

In this case, the IC testing device main body 2 comprises a DC section 5 and an LS section 6.

The DC section 5 measures the direct current characteristics of the analysis sample 1 based on analysis data received from test station 3 and test station 4. The LS station 6 selects the voltage levels to be applied to the I/O terminals of analysis sample 1 for each terminal of the analysis sample 1, and supplies these to test station 3 and test station 4.

Additionally, test station 3 and test station 4 respectively comprise an analog circuit 7, a pin electronics section 8, a first power source 9, a second power source 10, and a solid-state relay 11. The analog circuit 7 and the second power source 10 together form an analog section 12.

While the internal components of test station 3 and test station 4 are identical in the present embodiment, they are not necessarily identical.

The analog circuit 7 has a digital/analog converter (DAC), which DA converts analysis data (digital values) received from the IC testing device main body 2, and inputs the DA converted analog voltages to the analog input terminal ($A_{in}$ terminal) of the analysis sample 1 (AD converter).

The pin electronics section 8 performs a comparison between the digital values (digital values AD converted by the analysis sample 1) outputted from the I/O terminals of the analysis sample 1 (AD converter) and reference values (digital values) received from the IC testing device main body 2.

In the present embodiment, since the analysis sample 1 is an AD converter, the pin electronics section 8 performs a comparison between digital values AD converted by the AD converter and reference values (digital values) received from the IC testing device main body 2. On the other hand, if the analysis sample is a DA converter, the pin electronics section 8 applies digital signals to the I/O terminals of the analysis sample 1 for DA conversion by the analysis sample 1 (DA converter).

In test station 3 and test station 4, the first power source 9 is shared as the power source for both the analog section 12 and the pin electronics section 8. Additionally, in test station 3 and test station 4, the second power source 10 is used as an exclusive power source for the analog section 12.

With regard to the GND system, the GND of the first power source 9 is a digital GND, while the GND of the second power source 10 is an analog GND.

Thus, since the GND system is such that the analog GNDs of test station 3 and test station 4 are separated, they will not be mutually affected by noise generated in the other test station, thereby improving the S/N ratio.

Additionally, a solid-state relay 11 is provided on each of test station 3 and test station 4, in order to perform ON/OFF control for supplying 200 V AC to the first power source 9 and the second power source 10 in each test station. Consequently, either one of the test stations can be operated alone by turning ON the solid-state relay of that test station.

Of course, if the solid-state relays 11 of both test stations are turned ON, then it is possible to operate both test stations.

Additionally, the analog circuit 7 and the pin electronics section 8 of each test station are respectively directly connected to the DC section 5 of the IC testing device main body 2 by tester buses. Similarly, the analog circuit 7 and the pin electronics section 8 of each test station are respectively connected to the LS section 6 of the IC testing device main body 2 by tester buses. Consequently, each unit (analog circuit 7 and pin electronics section 8) of a test station can exchange data with the IC testing device main body 2 even if only the solid-state relay 11 of one test station is turned ON.

While an embodiment of the present invention has been described in detail above with reference to the drawings, the specific structure is not necessarily restricted by this embodiment, and all modifications of the design within a range such as not to contradict the gist of the present invention are also included within the scope of the present invention.

For example, while the number of test stations in the above-described embodiment was two, the number of test stations is not restricted to two, and there may be more.

Additionally, while the embodiment was explained using an example in which there are two units (analog section 12 and pin electronics section 8) inside each test station, the number of component units of the test stations is not restricted to two, and the present invention is applicable to any device in which there are one or more units.

The invention claimed is:

1. An integrated circuit testing device comprising at least two test stations for testing separate integrated circuits, each test station having: an analysis unit for analyzing characteristics of a corresponding integrated circuit based on signals from control means; a power source for supplying electrical voltage to said analysis unit; and power source control means for performing ON/OFF control of said power source.

2. An integrated circuit testing device in accordance with claim 1, wherein each of said analysis units directly exchanges signals with its associated control means.

3. An integrated circuit testing device in accordance with claim 2, wherein each power source has an analog power supply section, said analog power supply section being grounded separately for each test station.

4. An integrated circuit testing device in accordance with claim 1, wherein each power source has an analog power supply section, said analog power supply section being grounded separately for each test station.

* * * * *